(12) United States Patent
Lin et al.

(10) Patent No.: US 9,071,240 B2
(45) Date of Patent: Jun. 30, 2015

(54) LOW POWER, SINGLE-RAIL LEVEL SHIFTERS EMPLOYING POWER DOWN SIGNAL FROM OUTPUT POWER DOMAIN AND A METHOD OF CONVERTING A DATA SIGNAL BETWEEN POWER DOMAINS

(71) Applicant: Nvidia Corporation, Santa Clara, CA (US)

(72) Inventors: Hank Lin, Palo Alto, CA (US); Ge Yang, Dublin, CA (US); Xi Zhang, San Jose, CA (US); Jiani Yu, Fremont, CA (US); Haiyan Gong, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 13/626,100

(22) Filed: Sep. 25, 2012

(65) Prior Publication Data
US 2014/0084984 A1    Mar. 27, 2014

(51) Int. Cl.
*H03L 5/00* (2006.01)
*H03K 19/0175* (2006.01)
*H03K 19/0185* (2006.01)

(52) U.S. Cl.
CPC .......... *H03K 19/017509* (2013.01); *H03K 19/018507* (2013.01)

(58) Field of Classification Search
USPC ............ 327/333, 112, 142, 198, 427; 326/68, 326/80, 81; 365/189.11
See application file for complete search history.

(56) References Cited

U.S. PATENT DOCUMENTS

| | | | |
|---|---|---|---|
| 7,583,126 B2 | 9/2009 | Yang et al. | |
| 7,834,662 B2 * | 11/2010 | Campbell et al. | 327/333 |
| 7,839,170 B1 * | 11/2010 | Yang et al. | 326/68 |
| 7,995,410 B2 * | 8/2011 | Campbell et al. | 365/189.11 |
| 8,274,848 B2 * | 9/2012 | Adams et al. | 365/189.11 |
| 2010/0329062 A1 * | 12/2010 | Campbell et al. | 365/189.11 |

* cited by examiner

*Primary Examiner* — Long Nguyen

(57) ABSTRACT

Provided herein is a voltage level shifter, an apparatus including a voltage level shifter and a method of converting voltages between input and output power domains. In one embodiment, the voltage level shifter includes: (1) an input circuit configured to receive a data signal from an input power domain and a power down signal from a output power domain and (2) a transition circuit coupled to the input circuit and configured to receive the data signal and an inverted signal of the power down signal, wherein the input circuit and the transition circuit are both configured to connect to a supply voltage of the output power domain as a power source.

20 Claims, 4 Drawing Sheets

LOW POWER, SINGLE-RAIL LEVEL SHIFTERS EMPLOYING POWER DOWN SIGNAL FROM OUTPUT POWER DOMAIN AND A METHOD OF CONVERTING A DATA SIGNAL BETWEEN POWER DOMAINS

TECHNICAL FIELD

This application is directed, in general, to single-rail level shifters for integrated circuits (ICs) and, more specifically, to power saving, single-rail level shifters.

BACKGROUND

The need to reduce power consumption continues to influence the design of integrated circuits as the complexity of devices and the desire for mobility increases. One way to reduce overall power consumption for an integrated circuit is to include different power supply domains. Accordingly, functional blocks within an integrated circuit, such as timing critical blocks, can be operated at higher power supply voltages than other functional blocks of the integrated circuit which are deemed non-critical. Thus, a single integrated circuit, such as a chip, can include multiple functional blocks operating at different power supply voltages.

Communicating signals between the power supply domains having different power supply voltages typically requires converting the signals. Level shifters are often used in integrated circuits to convert data signals for use between the various power supply domains that operate at different power supply voltages by shifting the voltage level of the data signals.

SUMMARY

One aspect provides a voltage level shifter. In one embodiment, the voltage level shifter includes: (1) an input circuit configured to receive a data signal from an input power domain and a power down signal from a output power domain and (2) a transition circuit coupled to the input circuit and configured to receive the data signal and an inverted signal of the power down signal, wherein the input circuit and the transition circuit are both configured to connect to a supply voltage of the output power domain as a power source.

In another aspect, a method of converting voltages between an input power domain and an output power domain is provided. In one embodiment, the method includes: (1) receiving a supply voltage from the input power domain and (2) converting the supply voltage from the input power domain to the output power domain employing a voltage level shifter, wherein the voltage level shifter is a single-rail, bidirectional shifter.

In yet another aspect, an apparatus is provided. In one embodiment, the apparatus includes: (1) an input power domain, (2) an output power domain and (3) a single-rail, voltage level shifter configured to convert data signals from the input power domain to the output power domain. The voltage level shifter including: (3A) an input circuit configured to receive the data signal from the input power domain and a power down signal from the output power domain and (3B) a transition circuit coupled to the input circuit and configured to receive the data signal and an inverted signal of the power down signal.

BRIEF DESCRIPTION

Reference is now made to the following descriptions taken in conjunction with the accompanying drawings, in which.

DETAILED DESCRIPTION

Figure 1:
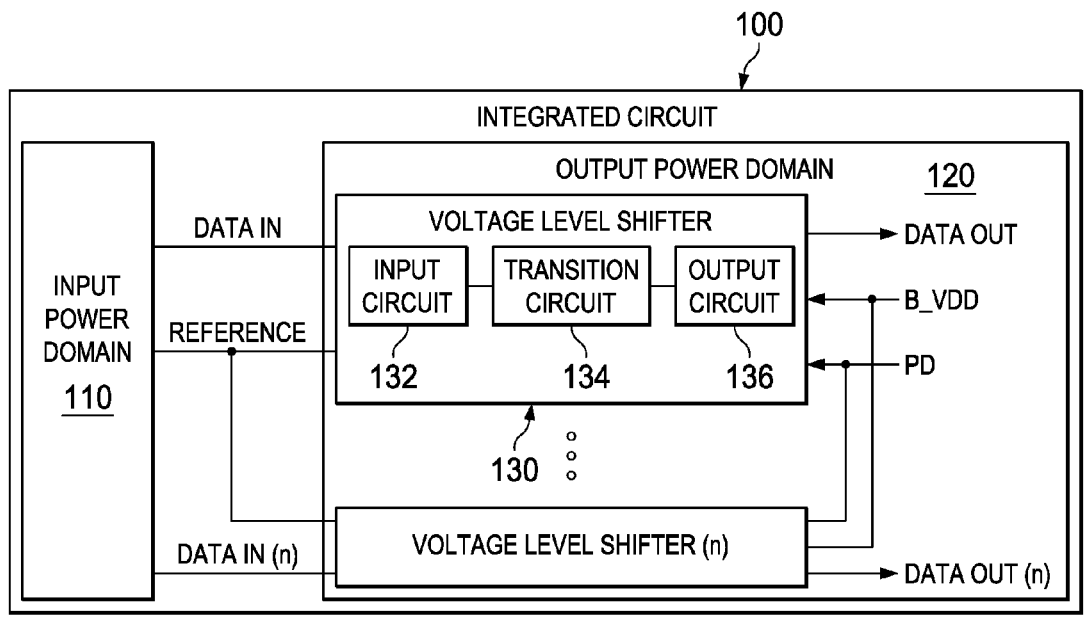
FIG. 1 illustrates a block diagram of an embodiment of an integrated circuit including a voltage level shifter constructed according to the principles of the disclosure.

As stated above, level shifters are often used in integrated circuits to convert voltages representing data signals for use between the various power supply domains (i.e., power domains). The addition of the level shifters, however, increases the complexity of an integrated circuit (e.g., adds more transistors) and can increase power consumption thereof due to leakage current or DC current associated with current paths created by the additional circuitry. Minimum leakage current voltage level shifters can be employed in integrated circuits but are often limited to a one way conversion. For example, a minimum leakage current voltage shifter may only shift a signal from a low power domain to a higher power domain (i.e., a shift-up design).

The power domains of integrated circuits, however, can employ a wider range of values for power supply voltages (i.e., supply voltages) to enable better trade-off between power and performance. As such, the supply voltages for functional blocks can be dynamically changed to operate at optimal voltages or frequencies within a given voltage range due to, for example, performance objectives or particular applications. Thus, the difference in supply voltages between coupled power domains can vary. In some applications, the differences in supply voltages can dynamically vary during operation. For example, if a power domain A, an originating domain, had a supply voltage equal to 1V and power domain B, a destination domain, had a supply voltage equal to 1.2V, then a shift-up level shifter could be used since the destination power domain B would have a supply voltage greater than the supply voltage of the originating power domain A. However, if both power domain A and power domain B have a supply voltage range that ranges from 0.8V to 1.2V, then the conversion of a data signal from domain A to domain B could be 0.8V to 1.2V, or 1.2V to 0.8V. As such, a dedicated shift-up level shifter would not be appropriate.

As such, the disclosure provides a voltage level shifter that works as both a shift-up and shift-down voltage shifter over a wide input/output range of supply voltage values. Thus, the bidirectional voltage level shifter disclosed herein can be employed when the supply voltage of an originating power domain (input power domain) can be greater than the supply voltage of an destination power domain, (output power domain) or vice versa. The disclosed bidirectional voltage level shifter can therefore be employed with different power domains wherein the low power domain and the higher power domain can change. The supply voltage change can be dynamic during operation or can be set for particular applications. Regardless, the bidirectional voltage level shifter provides a generic circuit for use in both shift-up and shift-down situations. Accordingly, the design and layout of integrated circuits is simplified.

The disclosed bidirectional shifter is a low power, single rail level shifter. The disclosure also provides a low power, single rail voltage level shifter that is configured for shifting-up. Thus, in addition to a bidirectional shifter, the disclosure provides an embodiment of an improved shift-up level shifter.

Each of the voltage level shifter embodiments disclosed herein are configured to receive a power down signal from the output power domain. As such, the disclosed voltage level shifters prevent or at least reduce current leakage or DC current when the output domain is powered down. In the disclosed embodiments, preventing current leakage or DC current is construed as partial or full prevention. By reducing the aforementioned current leakage, power savings can be obtained when an output domain is powered down.

FIG. 1 illustrates a block diagram of an embodiment of an integrated circuit 100 including a voltage level shifter 130 constructed according to the principles of the disclosure. The integrated circuit 100 can be a chip, such as a processor or a microprocessor. In one embodiment, the integrated circuit 100 is a chip of a mobile communication device. In another embodiment, the integrated circuit 100 is a block (or a portion) of a graphics processor. One skilled in the art will understand that the integrated circuit 100 can include additional components, interfaces, connections, etc., that are typically included in an integrated circuit but are not illustrated or discussed in the present disclosure.

The integrated circuit 100 includes an input power domain 110, an output power domain 120 and voltage level shifters. Voltage level shifter 130 is specifically denoted to represent the n voltage level shifters. The input power domain 110 and the output power domain 120 can be conventional functional blocks of an integrated circuit. For example, the input power domain 110 or the output power domain 120 may be a processing unit of the integrated circuit 100. In FIG. 1 the n voltage shifters are located within the output power domain 130. In some embodiments the n voltage shifters, or at least some of the voltage shifters, can be located between the input power domain 110 and the output power domain 120.

The input power domain 110 operates at a first supply voltage, referred to herein as A_VDD, and the output power domain 120 operates at a second supply voltage, referred to herein as B_VDD. Typically, the first and second power supply voltages are different and can vary in value. As noted above, the change in values of the first and second power supply voltages A_VDD and B_VDD can be due to obtaining optimum power and performance for the different domains within the operating ranges of the input power domain 110 and the output power domain 120.

The voltage level shifter 130 is configured to convert a data signal from the input power domain 110 to a data signal for the output power domain 120. As such, the voltage level shifter 130 is configured to shift the voltage level of the data signal from the input power domain 110 to the applicable voltage level of the output power domain 120. Accordingly, the voltage level shifter 130 is configured to convert the ground voltage of an input domain 110 ("input domain ground voltage") to the ground voltage of the output domain 120 ("output domain ground voltage") and the supply voltage A_VDD of the input domain 110 to the supply voltage B_VDD of the output domain 120. In one embodiment, the voltage level shifter 130 converts the ground voltage of the input domain 110 to the ground voltage of the output domain 120 when in a first state and converts the supply voltage of the input domain 110 to the supply voltage of the output domain 120 when in a second state. In the embodiments disclosed herein, the ground voltages of the input and output domains 110, 120, are a common ground voltage ("GND" or "ground"). One skilled in the art will understand that in other embodiments, ground voltages of the input domain 110 and the output domain 120 can be different voltages.

When converting, the voltage level shifter 130 can be triggered to change from the first state to the second state when the data signal (i.e., the voltage of the data signal) changes from ground to A_VDD. Likewise, the voltage level shifter 130 can be triggered to change from the second state to the first state when the data signal changes from A_VDD to ground. One skilled in the art will understand that the designations of the first state and second state are arbitrary designations that do not imply an order.

The supply voltages within the input domains 110 and the output domain 120 can vary significantly depending on the application and the processing technology employed. An example of voltage values for the input and output domains 110, 120, within a typical processing technology range from 0.8V to 1.2V. Threshold voltages for n-type transistors that correspond with these voltage domains can be between 200 mV to 350 mV and threshold voltages for p-type transistors for these voltage domains can be between −350 mV to −200 mV. The range of the threshold voltages can be caused by, for example, different device Vt types (e.g., HVT, SVT, LVT . . . ), processing variation, temperature changes, etc. The range of the supply voltages can result from, for example, the desire to optimize power and performance. The voltage level shifter 130 receives B_VDD as a supply voltage. The voltage level shifter 130 includes complementary metal-oxide-semiconductor (CMOS) devices (e.g., NMOS and PMOS devices).

In one embodiment, the voltage level shifter 130 is a bidirectional shifter configured to shift the voltage level of the data signal both up and down. For example, the voltage level shifter 130 may be configured as the voltage level shifter 400 in FIG. 4. In another embodiment, the voltage level shifter 130 may be configured to only shift up the voltage level of the data signal. Accordingly, the voltage level shifter 130 may be implemented as the voltage level shifter 200 in FIG. 2. Regardless the embodiment, the disclosed voltage level shifters reduce power consumption by limiting or preventing undesired currents, operate as single rail shifters and employ a power down signal from the output power domain.

The voltage level shifter 130 includes an input circuit 132, a transition circuit 134 and an output circuit 136. The input circuit 132 is configured to receive the data signal from the input power domain 110 and a power down signal from the output power domain 120. The data signal can be a voltage that corresponds to a logic high or logic low signal. Thus, in one embodiment the data signal is A_VDD or the ground voltage of the input power domain 110.

The power down signal (PD in FIG. 1) is a voltage signal from the output power domain 120 instructing the voltage level shifter 130 to power down. In one embodiment, the power down signal is received from a "power down pin" of the output power domain 120. A central processor or controller of the integrated circuit 100 may initiate the power down signal. The input circuit 132 is also configured to receive a reference voltage (REF. in FIG. 1) from the input power domain 110. The reference voltage can be A_VDD or can be an inversion of the ground voltage of the input circuit 110.

The power down signal and the reference voltage are not timing critical and can be connected to multiple voltage level shifters as indicated in FIG. 1. As such, the voltage level shifter 130 can reduce the number of signals that need to be routed compared to some conventional level shifters such as a dual rail voltage shifter. For example, if there are 1,000 data signals that need to be routed from the input power domain 110 to the output power domain 120 (n of FIG. 1 is a 1,000), a 1,000 of the voltage level shifter 130 are needed. In comparison, if a dual rail level shifter is used, 2,000 data signals will need to be routed.

The transition circuit 134 is coupled to the input circuit 132 and is configured to receive the data signal and an inversion of the power down signal (i.e., an inverted power down signal). The output circuit 136 is coupled to both the input circuit 132 and the transition circuit 134 and is also configured to receive the inverted power down signal. The input circuit 132, the transition circuit 134 and the output circuit 136 are each configured to connect to B_VDD for a power source. As such, each of the input circuit 132, the transition circuit 134 and the output circuit 136 are configured to connect to a single-rail input of the output power domain 120 and employ the single-rail input as a power source.

The input circuit 132, transition circuit 134 and output circuit 136 each provide a path from B_VDD to ground. As such, the voltage level shifter 130 includes switches that are configured to control leakage and DC current through each of these circuits during various operating modes of the voltage level shifter 130.

Figure 2:
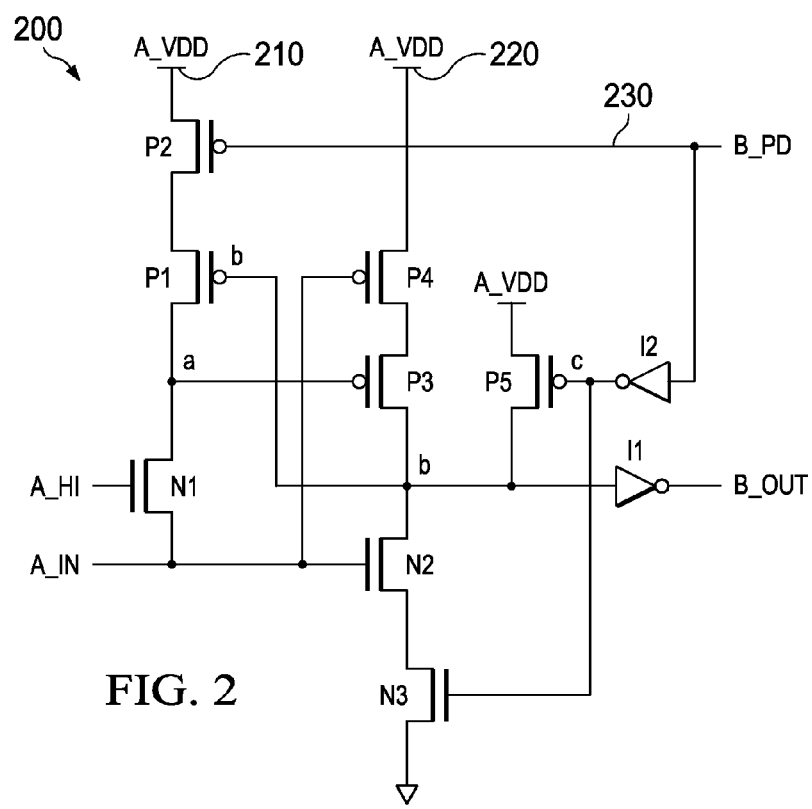
FIG. 2 illustrates a schematic diagram of an embodiment of a voltage level shifter constructed according to the principles of the disclosure.

Turning now to FIG. 2, a schematic diagram of an embodiment of a voltage level shifter 200 constructed according to the principles of the disclosure is illustrated. The voltage level shifter 200 is configured to convert data signals between power domains of integrated circuits, such as the input power domain 110 and the output power domain 120 of FIG. 1. The voltage level shifter 200 is configured to convert data signals by shifting-up. As such, the voltage level shifter 200 is applicable for converting a data signal from a low power domain to a data signal for a higher power domain. The voltage level shifter 200 includes an input circuit 210, a transition circuit 220 and an output circuit 230. Various nodes or contact points are also denoted in FIG. 2 to aid in describing the connections and operation of the voltage level shifter. The voltage level shifter 200 is configured to employ the power supply voltage of the output power domain represented by B_VDD in FIG. 2. Accordingly, the input circuit 210, the transition circuit 220 and the output circuit 230 are connected to B_VDD. For the voltage level shifter 200, the supply voltage B_VDD has a greater value than the supply voltage A_VDD of the input power domain. As such, in FIG. 2 the input domain is a low power domain and the output domain is a high power domain.

The input circuit 210 includes a p-type transistor P1, a p-type transistor P2 and an n-type transistor N1 that are connected together in series. A source of P2 is connected to B_VDD and a drain is connected to the source of P1. A source of N1 is connected to data signal A_IN, which is the input signal from power domain A. The drain of N1 is connected to the drain of P1 at node "a." The gate of N1 is connected to the reference voltage A_HI from power domain A, which is the low voltage domain in FIG. 2. Domain A can provide A_HI or the ground or low voltage of domain A that is then inverted for delivery to the gate of N1. The gate of P1 is connected to output node "b" and the gate of P2 is connected to the power down control signal B_PD from domain B.

The transition circuit 220 includes serially connected p-type transistors P3 and P4 and n-type transistors N2 and N3. The source of N3 is connected to the ground and the drain is connected to the source of N2. The drain of N2 is connected to node b and the gate of N2 is connected to A_IN. The gate of N3 is connected to the inverted power down control signal from domain B at node "c." The gate of P4 is connected to A_IN and the gate of P3 is connected to node a.

The output circuit 230 includes p-type transistor P5 having a source connected to B_VDD and a drain connected to the node b. The output circuit 230 also includes inverters I1 and I2. The input of inverter I1 is connected to the node b and provides B_OUT at the output terminal thereof. B_OUT is the converted data signal from input data signal A_IN that has been voltage shifted-up for domain B.

The inverter I2 has an input and an output terminal. The input terminal of inverter I2 is connected to the power down signal B_PD and the output terminal is connected to node c and provides the inverted power down signal thereat. The gate of P5 is also connected to the inverted power down signal at output contact c.

Table 1 illustrates various modes of operation associated with the voltage level shifter 200.

TABLE 1

| Modes of Operation for Voltage Level Shifter 200 | | |
|---|---|---|
| | NORMAL MODE | POWER DOWN MODE |
| B_PD | 0 | B_VDD |
| A_HI | A_VDD | X |
| A_IN | 0/A_VDD | X |
| B_OUT | 0/B_VDD | 0 |

Figure 3:
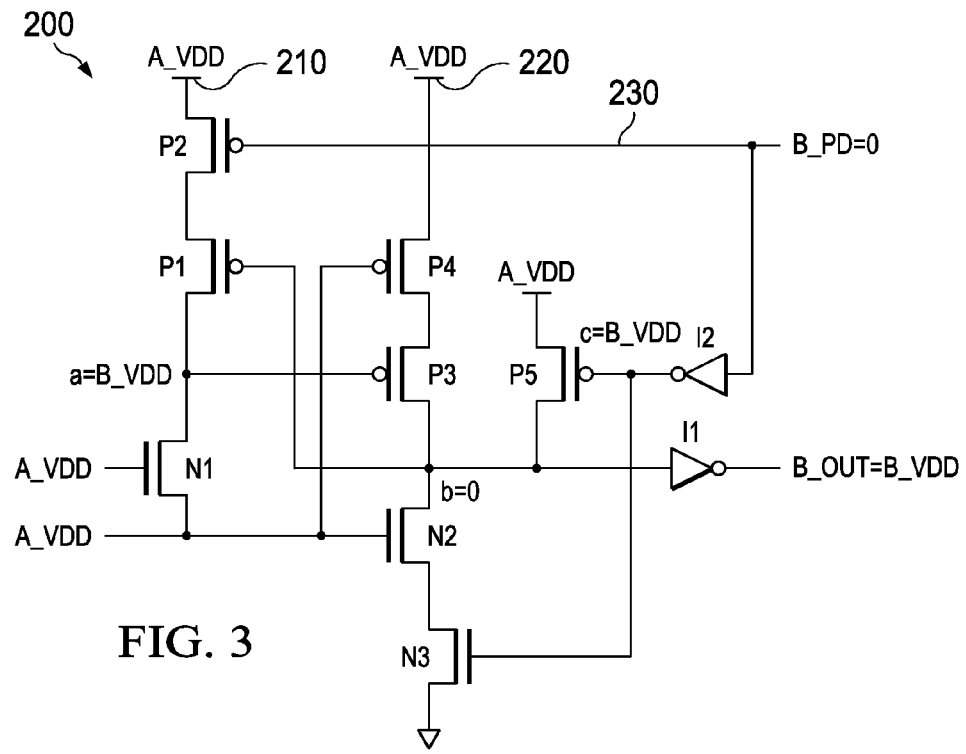
FIG. 3 illustrates the voltage level shifter of FIG. 2 in the context of a normal operating mode.

In the "Normal Mode" and "Power Down Mode" columns, the various values are particular voltages which represent logical values or "X" which could be different values (i.e., unknown or do not care). Shown in the above table, in the normal mode, B_PD=0 and A_HI=A_VDD. When A_IN=0 in the normal mode, B_OUT=0 and when A_IN=A_VDD in the normal mode, B_OUT=B_VDD. While in the power down mode, B_PD=B_VDD regardless the value of A_IN and A_HI (represented by "X" in the above table) and B_OUT=0. FIG. 3 illustrates the voltage level shifter 200 in the context of the normal mode. As such, B_PD=0, and A_HI=A_VDD. N3 and P2 are activated and P5 is deactivated.

When A_IN=A_VDD, N2 is on, node b=0, and B_OUT=B_VDD. P4 is partially activated or fully activated depending on the value of A_VDD, B_VDD and the threshold voltage of P4. N2 and N3 are sized to ensure that the node b can be pulled down to 0 even if P4 is fully on. P3 and P1 are used to cut off the DC current that would flow through P4 and N2 (P4 and N2 are both on) and thus reduce power. Since node b=0, P1 is activated and P1 pulls up node a to B_VDD. The source and gate of P3 are both at B_VDD, so P3 is deactivated and there is no DC current flowing through B_VDD to ground. The drain of N1 is B_VDD and the gate and the source of N1 are both at A_VDD. Thus, N1 is deactivated.

Figure 4:
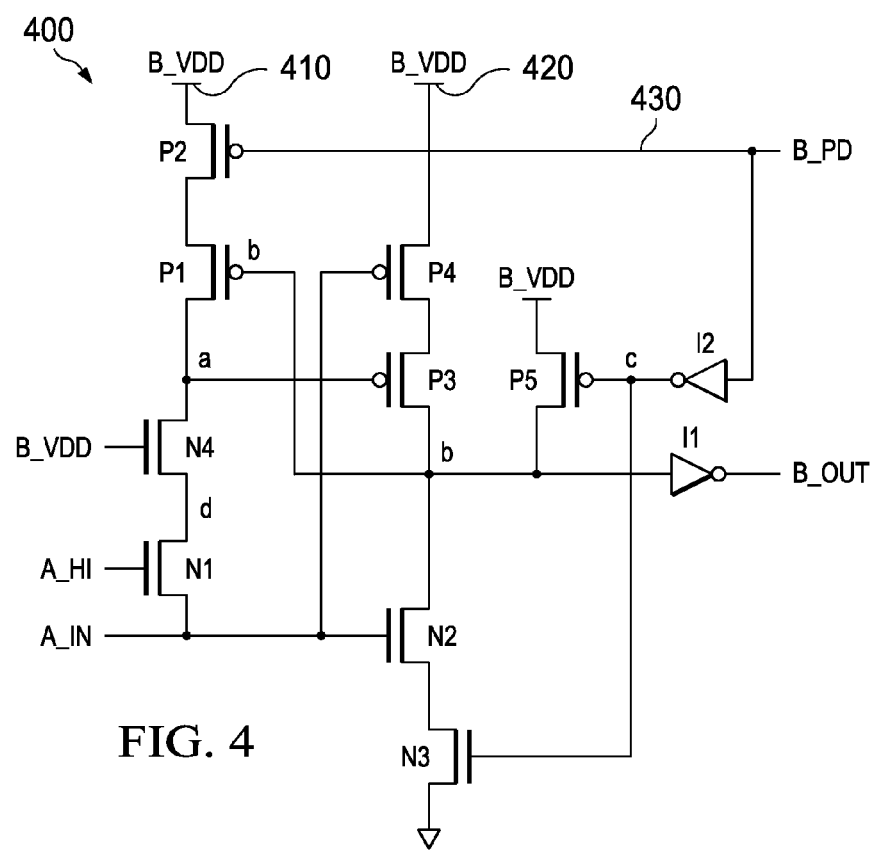
FIG. 4 illustrates a schematic diagram of another embodiment of a voltage level shifter constructed according to the principles of the disclosure.

The above description indicates operation of the voltage level shifter 200 when shifting up from a low power domain to a higher power domain. The voltage level shifter 200 advantageously employs the power down signal from the output power domain B_PD and provides a level shifter for shifting up a data signal. FIG. 4 illustrates a schematic diagram of another voltage level shifter that employs the power down signal from the output power domain. Additionally, the level shifter of FIG. 4 is designed for both shifting-up and shifting-down a data signal. In one embodiment, FIG. 2 and FIG. 4 represent entries of a cell library that can be used for integrated circuit design.

FIG. 4 illustrates a schematic diagram of another embodiment of a voltage level shifter 400 constructed according to the principles of the disclosure. The voltage level shifter 400 is configured to convert data signals between power domains of integrated circuits, such as the input power domain 110 and the output power domain 120 of FIG. 1. The voltage level shifter 400 is configured to convert data signals by both shifting-up and shifting-down as needed. In one embodiment, the voltage level shifter 400 dynamically shifts-up or shifts-down when converting a data signal between power domains according to the operating voltages of the input power domain and the output power domain. The voltage level shifter 400 includes an input circuit 410, a transition circuit 420 and an output circuit 430. Various nodes or contact points are also denoted in FIG. 4 to aid in describing the connections and operation of the voltage level shifter. The voltage level shifter 400 is configured to employ the supply voltage of the output power domain represented by B_VDD in FIG. 2. Accordingly, the input circuit 410, the transition circuit 220 and the output circuit 230 are connected to B_VDD.

The input circuit 410 includes a p-type transistor P1, a p-type transistor P2, a n-type transistor N1 and a n-type transistor N2 that are connected together in series. A source of P2 is connected to B_VDD and a drain is connected to the source of P1. A source of N1 is connected to the data signal A_IN, which is the input signal from domain A. The drain of N1 is connected to the source of N4 and the drain of N4 is connected to the drain of P1 at node "a." The gate of N1 is connected to the reference voltage from domain A, A_HI. A_HI has the same value as A_VDD. Domain A can provide A_VDD or the ground or low voltage of domain A that is then inverted for delivery to the gate of N1. In addition to providing power for the voltage level shifter 400, the gate of N4 is also connected to B_VDD. The gate of P1 is connected to output node "b" and the gate of P2 is connected to the power down control signal B_PD from domain B. In contrast to the voltage level shifter 200, the voltage level shifter 400 includes an NMOS transistor N4 in series between P1 and N1 with the gate of N4 connected to B_VDD.

The transition circuit 420 includes serially connected p-type transistors P3 and P4 and n-type transistors N2 and N3. The source of N3 is connected to the ground and the drain is connected to the source of N2. The drain of N2 is connected to the node b and the gate of N2 is connected to A_IN. The gate of N3 is connected to the inverted power down control signal from domain B at node "c." The gate of P4 is connected to A_IN and the gate of P3 is connected to node a.

The output circuit 430 includes p-type transistor P5 having a source connected to B_VDD and a drain connected to node b. The output circuit 230 also includes inverters I1 and I2. The input terminal of inverter I1 is connected to the node b and provides B_OUT at the output terminal thereof. B_OUT is the converted data signal from input data signal A_IN that has been voltage shifted (either up or down) for domain B.

The input terminal of inverter I2 is connected to the power down signal B_PD and provides the inverted power down signal at its output terminal which is connected to node c. The gate of P5 is also connected to the inverted power down signal at node c. Table 2 below shows the operating modes of the voltage level shifter 400. In the "Normal Mode" and "Power Down Mode" columns, the various values are particular voltages which represent logical values or "X" which could be different values (i.e., do not care).

TABLE 2

Operating Modes of Voltage Level Shifter 400

| | NORMAL MODE | POWER DOWN MODE |
|---|---|---|
| B_PD | 0 | B_VDD |
| A_HI | A_VDD | X |
| A_IN | 0/A_VDD | X |
| B_OUT | 0/B_VDD | 0 |

Figure 5:
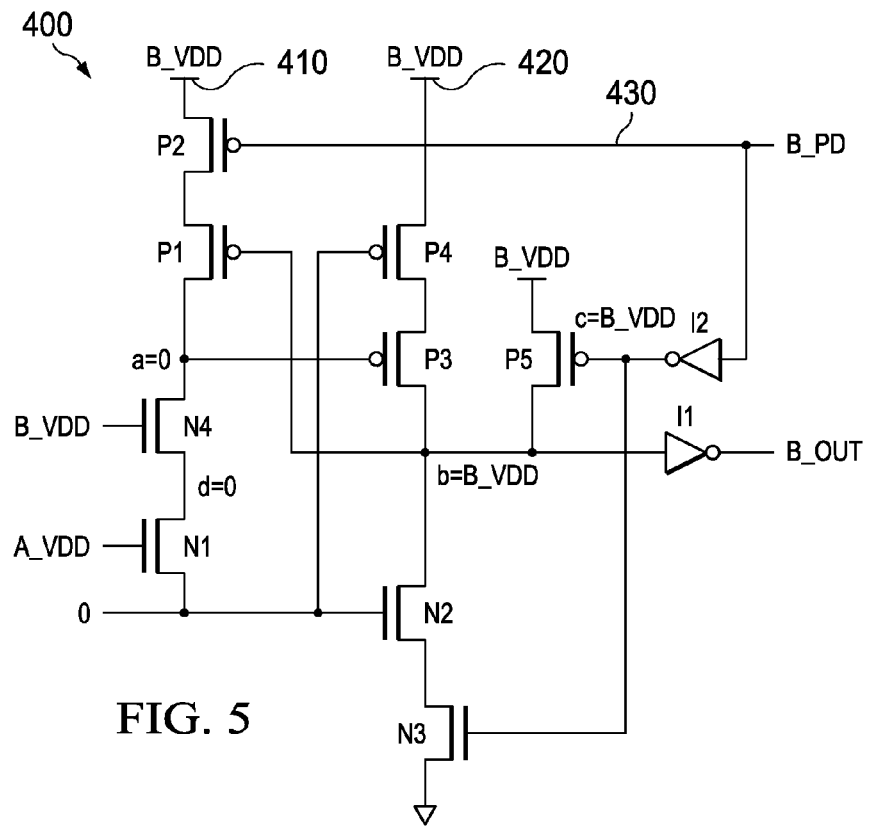
FIG. 5 and FIG. 6 illustrate the voltage level shifter of FIG. 4 in the context of a normal operating mode.

In FIG. 5, the voltage level shifter 400 is illustrated in the normal operating mode. As such, B_PD=0 and A_HI=A_VDD. N3 and P2 are activated and P5 is deactivated. When A_IN=0 in the normal mode, N2 is deactivated and P4 is on. N1 is activated and pulls down node d from B_VDD to 0. N4 is also activated and pulls node a from B_VDD to 0 through N1. P1 is designed as a weak pull-up device and the size of N1 and N4 are selected to ensure they can pull node a to zero (0) when P1 is on. For 28 nm technology, for example, such as Taiwan Semiconductor Manufacturing Company (TSMC) 28 nm high performance (28 nm hp) processing, P1 can be sized at W=0.12 um, L=0.06 um, and N1/N4 is sized at W=1.32 um, L=0.3 um. After node a has been pulled down to zero (0), P3 is on. P4 and P3 will pull node b to B_VDD. As such, P1 will be turned off and B_OUT will be 0. There is no DC current flowing through B_VDD since P1, N2 and P5 are deactivated.

Figure 6:
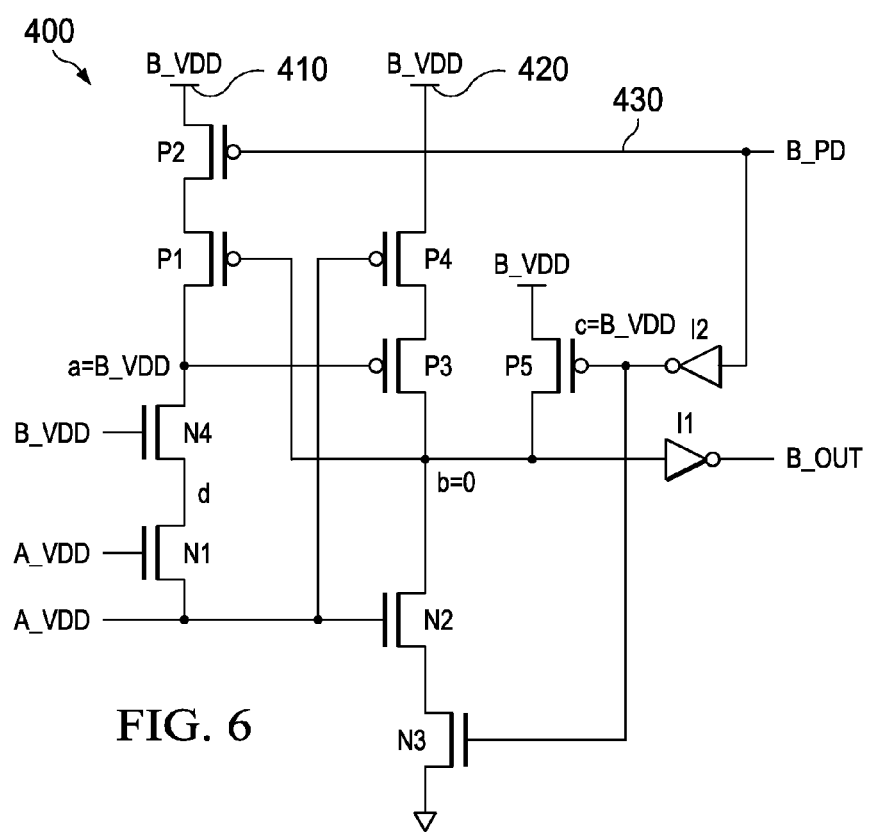

In FIG. 6, the voltage level shifter 400 is illustrated in the normal mode wherein A_IN=A_VDD. As noted in Table 2, in the normal mode B_PD=0 and A_HI=A_VDD. As such, N3 and P2 are activated and P5 is deactivated.

With A_IN=VDDL, N2 is on, node b=0, and B_OUT=B_VDD. P4 is partially activated or fully activated depending on the value of A_VDD, B_VDD and the threshold voltage of P4. The size of N2 and N3 is selected to ensure that node b can be pulled down to 0 even if P4 is fully on. N2 and N3, for example, can have a width W=0.66 um and a length L=0.3 um for the above noted 28 nm. P3 and P1 are used to cut off the DC current that would flow through P4 and N2 (P4 and N2 are both on). Since node b=0, P1 is activated and P1 pulls up node a to B_VDD. The source and gate of P3 are both B_VDD. P3, therefore, is deactivated and there is no DC current flowing through the transition circuit 420 of P4/P3/N2/N3.

For leakage/DC current path of the input circuit 410 (P2/P1/N4/N1), two cases are considered since the voltage level shifter 400 can both shift-up and shift-down. In the first case, A_VDD<B_VDD. In this case, N4 is activated and node d=B_VDD−Vth_n, the threshold voltage of N4. N1 is deactivated, wherein its gate and source nodes are A_VDD and its drain node is B_VDD−Vth_n at node d. Since N1 is deactivated, the DC current path of the input circuit 410 P2/P1/N4/N1 is deactivated.

In the second case, A_VDD>B_VDD. In this case, N1 is activated and node d=A_VDD−Vth_n. Additionally, N4 is deactivated, its gate and source nodes are B_VDD, and its drain node is A_VDD−Vth_n at node d. With N4 deactivated, the DC current path of input circuit 410 P2/P1/N4/N1 is incomplete.

Figure 7:
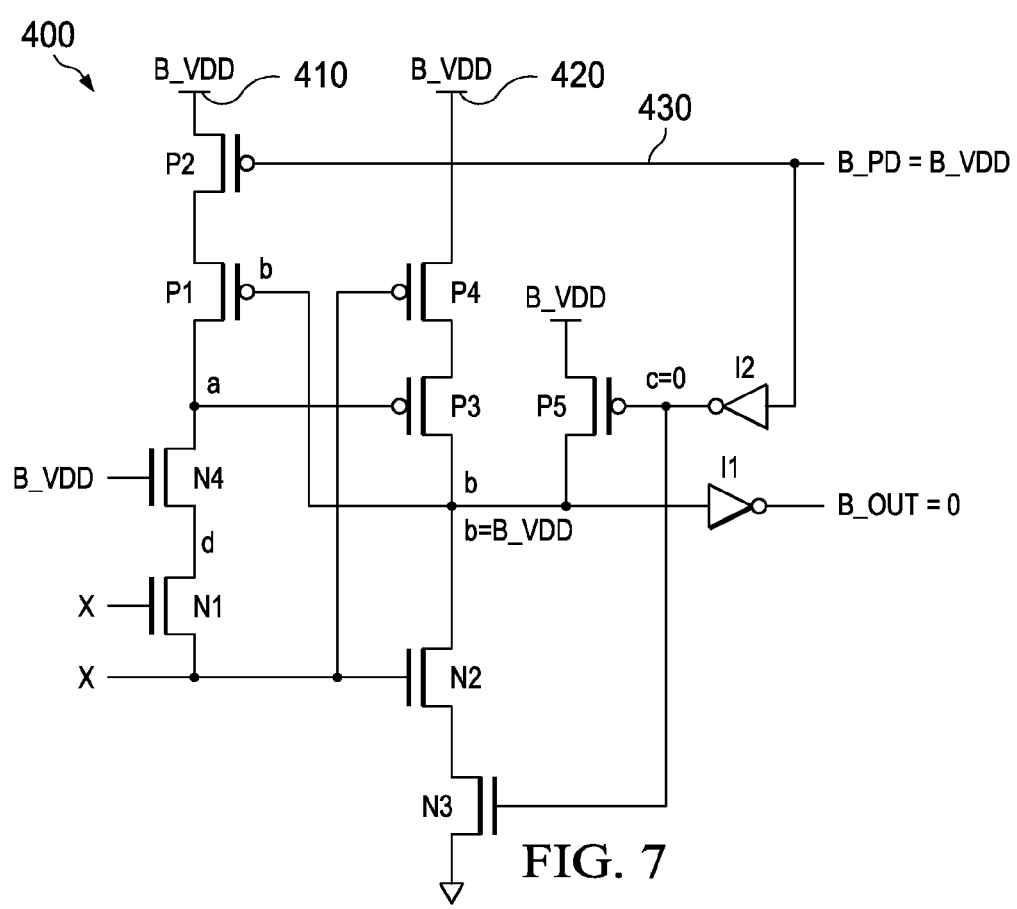
FIG. 7 illustrates the voltage level shifter of FIG. 4 in the context of a power down mode.

FIG. 7 illustrates the voltage level shifter 400 in the power down mode. As such, B_PD=B_VDD, and A_HI and A_IN are unknown. With B_PD=B_VDD, P2 is deactivated to cut off the leakage path of input circuit 410 P2/P1/N4/N1. Node c is at 0 and N3 is deactivated. Accordingly, the leakage path of transition circuit 420 P4/P3/N2/N3 is deactivated. In the power down mode, P5 is activated and node b is pulled to B_VDD. Thus, B_OUT is discharged to 0.

The disclosure provides voltage level shifters that are low power since the DC current paths from the supply voltage to ground are cut off by controlling switches. Additionally, the disclosed voltage level shifters route half the signals compared to conventional level shifters with dual-rail inputs. Power down control as disclosed herein also reduces or prevents DC current in the voltage level shifters when the input is floating. Furthermore, the disclosure provides a bidirectional shifter that shifts up and shifts down for a wide range of input/output VDD.

Those skilled in the art to which this application relates will appreciate that other and further additions, deletions, substitutions and modifications may be made to the described embodiments.

What is claimed is:

1. A voltage level shifter, comprising:
   an input circuit configured to receive a data signal from an input power domain and a power down signal from an output power domain; and
   a transition circuit coupled to said input circuit and configured to receive said data signal and an inverted signal of said power down signal, wherein said input circuit and said transition circuit are both configured to connect to an output supply voltage of said output power domain as a power source, said input circuit including a first switch configured to receive said output supply voltage and a second switch configured to receive an input supply voltage of said input power domain to control operation of said second switch, wherein operation of said first switch is based on a voltage difference between said input supply voltage and said output supply voltage.

2. The voltage level shifter as recited in claim 1 wherein said first switch is a n-type transistor having a gate configured to receive said output supply voltage.

3. The voltage level shifter as recited in claim 1 wherein said voltage level shifter is a bidirectional voltage shifter.

4. The voltage level shifter as recited in claim 1 wherein said first switch is positioned to control current flowing through said input circuit.

5. The voltage level shifter as recited in claim 1 wherein said first switch and said second switch are n-type transistors and said input circuit includes two p-type transistors coupled in series to said first switch and said second switch, wherein a gate of one of said p-type transistors is configured to connect to said power down signal.

6. The voltage level shifter as recited in claim 1 wherein said transition circuit includes two p-type transistors coupled in series to two n-type transistors, wherein a gate of one of said p-type transistors and a gate of a first one of said n-type transistors are configured to connect to said data signal and a gate of a second one of said n-type transistors is configured to connect to said inverted power down signal.

7. The voltage level shifter as recited in claim 1 wherein said voltage level shifter is a single-rail, bidirectional shifter.

8. A method of converting voltages between an input power domain and an output power domain, comprising:
   receiving an output supply voltage from said input power domain,
   converting said supply voltage from said input power domain to said output power domain employing a voltage level shifter, wherein said voltage level shifter is a single-rail, bidirectional shifter including an input circuit having a first switch configured to receive an output supply voltage from said output power domain and having a second switch configured to receive an input supply voltage of said input power domain to control operation of said second switch, wherein operation of said first switch is based on a voltage difference between said input supply voltage and said output supply voltage.

9. The method as recited in claim 8 wherein a value of said output supply voltage of said input power domain dynamically changes between being greater than or less than a value of said output power domain.

10. The method as recited in claim 8 wherein a value of said output supply voltage of said input power domain is less than a value of an output supply voltage of said output power domain.

11. The method as recited in claim 8 wherein said input power domain, said output power domain and said voltage level shifter are components of a device, and said converting includes shifting-up and shifting-down during operation of said device.

12. The method as recited in claim 8 further comprising receiving a power down signal from said output power domain.

13. The method as recited in claim 8 wherein said output supply voltage is a data signal from said input power domain.

14. The method as recited in claim 8 further comprising receiving said output supply voltage from said output power domain to control operation of said first switch of said voltage level shifter.

15. An apparatus, comprising:
   an input power domain;
   an output power domain; and
   a single-rail, voltage level shifter configured to convert data signals from said input power domain to said output power domain, said voltage level shifter including:
      an input circuit configured to receive said data signal from said input power domain, a power down signal from said output power domain, an output supply voltage of said output power domain and an input supply voltage of said input power domain to control a second switch of said input circuit, wherein a first switch of said input circuit is controlled based on a voltage difference between said input supply voltage and said output supply voltage; and
      a transition circuit coupled to said input circuit and configured to receive said data signal and an inverted signal of said power down signal.

16. The apparatus as recited in claim 15 wherein said input circuit and said transition circuit are both configured to connect to said output supply voltage of said output power domain as a power source.

17. The apparatus as recited in claim 15 wherein said apparatus is a mobile communication device, a processor or an integrated circuit.

18. The apparatus as recited in claim 15 wherein said voltage level shifter is a bidirectional voltage shifter.

19. The apparatus as recited in claim 15 wherein said voltage level shifter further includes an output circuit having a p-type transistor coupled between said output supply voltage of said output power domain and an output node of said voltage level shifter, wherein a gate of said p-type transistor is configured to connect to said inverted signal of said power down signal.

20. The apparatus as recited in claim 15 wherein said first switch and said second switch are n-type transistors and said input circuit includes a first and a second p-type transistor coupled in series to said first switch and said second switch, and said transition circuit includes a third and a fourth p-type transistor coupled in series to a third and a fourth n-type transistor.

* * * * *